US006893969B2

(12) United States Patent
Ho et al.

(10) Patent No.: US 6,893,969 B2
(45) Date of Patent: May 17, 2005

(54) USE OF AMMONIA FOR ETCHING ORGANIC LOW-K DIELECTRICS

(75) Inventors: Chok W. Ho, Milpitas, CA (US); Kuo-Lung Tang, Hsin-Chu (TW); Chung-Ju Lee, Hsin-Chu (TW)

(73) Assignee: Lam Research Corporation, Fremont, CA (US)

( * ) Notice: Subject to any disclaimer, the term of this patent is extended or adjusted under 35 U.S.C. 154(b) by 502 days.

(21) Appl. No.: 09/782,446

(22) Filed: Feb. 12, 2001

(65) Prior Publication Data

US 2002/0108929 A1 Aug. 15, 2002

(51) Int. Cl.[7] .......................................... H01K 21/302
(52) U.S. Cl. ...................... 438/706; 438/710; 438/712; 438/714; 438/720; 216/67; 216/72
(58) Field of Search .................. 438/700, 710, 438/712, 714, 720, 706; 216/58, 67, 72

(56) References Cited

U.S. PATENT DOCUMENTS

| | | | |
|---|---|---|---|
| 5,230,772 A | 7/1993 | Kadomura | 156/643 |
| 5,266,157 A | 11/1993 | Kadomura | 156/659.1 |
| 5,814,563 A * | 9/1998 | Ding et al. | 438/714 |
| 5,877,032 A * | 3/1999 | Guinn et al. | 438/9 |
| 5,970,376 A | 10/1999 | Chen | 438/637 |
| 6,037,255 A | 3/2000 | Hussein et al. | 438/675 |
| 6,040,248 A | 3/2000 | Chen et al. | 438/725 |
| 6,080,529 A * | 6/2000 | Ye et al. | 430/318 |
| 6,105,588 A | 8/2000 | Li et al. | 134/1.1 |
| 6,124,213 A | 9/2000 | Usami et al. | 438/710 |
| 6,153,511 A | 11/2000 | Watatani | 438/623 |
| 6,174,796 B1 | 1/2001 | Takagi et al. | 438/622 |
| 6,194,128 B1 | 2/2001 | Tao et al. | 430/313 |
| 6,245,663 B1 * | 6/2001 | Zhao et al. | 438/622 |
| 6,352,937 B1 * | 3/2002 | Kadomura et al. | 438/725 |
| 6,355,572 B1 * | 3/2002 | Ikegami | 438/706 |

FOREIGN PATENT DOCUMENTS

| | | | |
|---|---|---|---|
| EP | 0851474 A2 | 7/1998 | H01L/21/321 |
| JP | 09036089 | 2/1997 | H01L/21/3065 |
| WO | WO 01/04707 A1 | 1/2001 | G03F/7/42 |
| WO | 01-29879 A2 | 4/2001 | |
| WO | WO 01/59825 A1 | 8/2001 | H01L/21/311 |

OTHER PUBLICATIONS

International Search Report, Application No. PCT/US 02/03329, Date of Mailing: Jul. 22, 2003.
James C. Lin et al., "Microwave Imaging of Cerebral Edema", May 1982. Proceedings of the IEEE, vol. 70. No. 5.
T. Hasegawa et al., "Copper Dual Damascene Interconnects with Low–K ($K_{eff}$ <3.0) Dielectrics Using FLARE™ and an Organo–Silicate Hard Mask", 1999, IEEE.
International Search Report, Application No. PCT/US 02/03138, Date of Mailing Dec. 12, 2002.
Eto et al., "High Selectivity Photoresist Ashing by the Addition of $NH_3$ to $CF_4/O_2$ or $CHF_3/O_2$", SID 99 Digest, pp. 844–847.

(Continued)

*Primary Examiner*—Lan Vinh
(74) *Attorney, Agent, or Firm*—Beyer Weaver & Thomas, LLP (57) ABSTRACT

Method for etching organic low-k dielectric using ammonia, NH3, as an active etchant. Processes using ammonia results in at least double the etch rate of organic low-k dielectric materials than processes using N2/H2 chemistries, at similar process conditions. The difference is due to the much lower ionization potential of NH3 versus N2 in the process chemistry, which results in significantly higher plasma densities and etchant concentrations at similar process conditions.

21 Claims, 3 Drawing Sheets

OTHER PUBLICATIONS

Delsol et al., "Transformer Coupled Plasma Dielectric Etch for 0.25 μm Technologies", Elsevier, Microelectronic Engineering 50 (2000), pp. 75–80.

International Search Report, Nov. 20, 2002.

U.S. patent application Ser. No. 09/782,185, entitled "Unique Process Chemistry for Etching Organic Low–K Materials", filed Feb. 12, 2001.

U.S. patent application Ser. No. 09/782,678, entitled "Post–Etch Photoresist Strip with O2 and NH3 for Organosilicate Glass Low–K Dielectric Etch Applications", filed Feb. 12, 2001.

U.S. patent application Ser. No. 09/782,437, entitled "Use of Hydrocarbon Addition for the Elimination of Micromasking during Etching of Organic Low–K Dielectrics", filed Feb. 12, 2001.

* cited by examiner

USE OF AMMONIA FOR ETCHING ORGANIC LOW-K DIELECTRICS

RELATED APPLICATIONS

This application is also related to the commonly assigned U.S. patent application Ser. No. 09/781,185 entitled UNIQUE PROCESS CHEMISTRY FOR ETCHING ORGANIC LOW-K MATERIALS, by Helen H. Zhu, filed concurrently herewith and incorporated herein by reference.

This application is related to the commonly assigned U.S. patent application Ser. No. 09/782,678 entitled POST-ETCH PHOTORESIST STRIP WITH O2 AND NH3 FOR ORGANOSILICATF GLASS LOW-K DIELECTRIC ETCH APPLICATIONS, by Rao V. Annapragada et al. filed concurrently herewith and incorporated herein by reference.

This application is also related to the commonly assigned U.S. patent application Ser. No. 09/782,437 entitled USE OF HYDROCARBON ADDITION FOR THE ELIMINATION OF MICROMASKING DURING ETCHING OF ORGANIC LOW-K DIELECTRICS, by Chok W. Ho, filed concurrently herewith and incorporated herein by reference.

FIELD OF THE INVENTION

The present invention relates to semiconductor manufacture. More particularly, the present invention relates to the etching of organic low-k dielectrics in semiconductor wafers.

BACKGROUND OF THE INVENTION

Integrated circuits use dielectric layers, which have typically been formed from silicon dioxide, $SiO_2$, to insulate conductive lines on various layers of a semiconductor structure. As semiconductor circuits become faster and more compact, operating frequencies increase and the distances between the conductive lines within the semiconductor device decrease. This introduces an increased level of coupling capacitance to the circuit, which has the drawback of slowing the operation of the semiconductor device. Therefore, it has become important to use dielectric layers that are capable of effectively reducing the coupling capacitance levels in the circuit.

In general, the capacitance in an integrated circuit is directly proportional to the dielectric constant, k, of the material used to form the dielectric layers. As noted above, the dielectric layers in conventional integrated circuits have traditionally been formed of $SiO_2$, which has a dielectric constant of about 4.0. Dielectric layers formed of $SiO_2$ do not reduce the coupling capacitances sufficiently to levels required for increasing device densities and operating frequencies. In an effort to reduce the coupling capacitance levels in integrated circuits, the semiconductor industry has engaged in research to develop materials having a dielectric constant lower than that of $SiO_2$, which materials are suitable for use in forming the dielectric layers in integrated circuits. To date, a number of promising materials, which are sometimes referred to as "low-k materials", have been developed. Many of these new dielectrics are organic compounds. In the specification and claims, the definition of a low-k material, is a material with a dielectric constant less than 4.

Low-k materials include, but are specifically not limited to: benzocyclobutene or BCB; Flare™ manufactured by Allied Signal® of Morristown, N.J., a division of Honeywell, Inc., Minneapolis, Minn.; one or more of the Parylene dimers available from Union Carbides Corporation, Danbury Conn.; polytetrafluoroethylene or PTFE; and SiLK®. One PTFE suitable for IC dielectric application is SPEEDFILM™, available from W. L. Gore & Associates, Inc, Newark, Del. SiLK®, available from the Dow®Chemical Company, Midland, Mich., is a silicon-free BCB.

During semiconductor wafer processing, features of the semiconductor device are defined in the wafer using well known patterning and etching processes. In these processes a photoresist (PR) material is deposited on the wafer and then is exposed to light filtered by a reticle. The reticle is generally a glass plate that is patterned with exemplary feature geometries that blocked light from propagating through the reticle.

After passing through the reticle, the light contacts the surface of the photoresist material. The light changes the chemical composition of the photoresist material such that a developer can remove a portion of the photoresist material. In the case of positive photoresist materials the exposed regions are removed, and in the case of negative photoresist materials the unexposed regions are removed. Thereafter the wafer is etched to remove the underlying material from the areas that are no longer protected by the photoresist material and thereby define the desired features in the wafer. Low-k organic polymers in general can be etched by oxidation (e.g. oxygen-based) or reduction (e.g. hydrogen-based) chemical processes.

The etching of organic low-k dielectrics may be advantageously accomplished in a dual-frequency capacitively-coupled (DFC) dielectric etch system. One such is Lam® Research model 4520XLE™, available from Lam® Research Corporation, Fremont Calif. The 4520XLE™ system processes an extremely comprehensive dielectric etch portfolio in one system. Processes include contacts, vias, bilevel contacts, borderless contacts, nitride and oxide spacers, and passivation.

Advanced etch systems like the 4520XLE™ perform several processes in the same system. By performing many different semiconductor fabrication steps in a single system, wafer throughput can be increased. Even further advanced systems contemplate the performance of additional steps within the same equipment. Again by way of example, but not limitation, Lam® Research Corporation's Exelan™ and Exelan-HP™ systems are dry etch systems capable of performing many process steps in a single apparatus. Exelan™ enables hardmask open, inorganic and organic ARC etch, and photoresist strip to be performed in situ with a single chamber. This system's extensive process portfolio includes all dual damascene structures, contacts, vias, spacers, and passivation etch in doped and undoped oxides and low-k dielectrics required in the sub-0.18 micron environment. Of course, the principles enumerated herein may be implemented in wide variety of semiconductor fabrication systems, and these principles specifically contemplate all such alternatives.

As used herein, the term in situ refers to one or more processes performed on a given substrate, such as a silicon wafer, in the same piece of semiconductor fabrication equipment without removing the substrate from the equipment.

As discussed, the etching of organic low-k dielectrics may be accomplished using oxygen-based or hydrogen-based etching processes. Each of these is, however, less than ideal.

Hydrogen-based etching processes, e.g.: N2/H2 processes, are less than ideal for etching organic low-k dielectrics, particularly for etching the high-density features required in current sub-0.18 micron devices. This is true for a number of reasons. First, current N2/H2 processes offer generally slow etch rates and poor profile control of the etched features: bowing and re-entrant etch profiles are particular problems. Another problem relates to high aspect ratio features having differing sizes, which features are etched concurrently.

The etching of high aspect ratio trenches, sometimes referred to as HART, into low-k materials is becoming increasingly important for micro- and nano-engineering. One example is in the case of comb-driven structures, trench capacitors, and trench isolation for vertical transistors. The aspect ratio, AR, is defined as the depth of the trench divided by its width. Currently, one of the most commonly implemented techniques for etching HART's is dry reactive ion etching, or RIE.

When etching HART's with RIE it is observed that the etch rate is dependant on time and the mask opening. In general, smaller trench openings are etched more slowly than those that are wider. Accordingly, large features etch at a faster rate than small features. This effect is known as Aspect Ratio Dependent Etch (ARDE) or "RIE lag". Known N2/H2 etch processes incur not only significant RIE lag, but more importantly, also exhibit etched profile angle dependence on feature size.

Another problem with known N2/H2 chemistries is that they have generally poor selectivity with respect to the oxides and nitrides commonly used as hard masks during etching. This means that the hard mask that should provide accurate feature definition is itself etched away fairly quickly during dielectric etch by the N2/H2 etch chemistry.

Another problem with N2/H2 plasmas is that in general they are stable only over fairly narrow ranges of pressure and power as a result of the high ionization potential of N2.

Finally, etching of organic low-k dielectrics with known N2/H2 processes is slow. This leads to reduced wafer throughput and increased cost of ownership of processing equipment for the integrated circuit manufacturer.

The slow etch rates obtainable by N2/H2 processes is often overcome using oxidative processes, most especially utilizing oxygen, O2 and a diluent such as nitrogen, N2. O2/N2 etch systems tend to possess much faster etch rates than N2/H2 systems, but are especially prone to bowing and can degrade the dielectric constant of the low-k dielectric. More troubling, they introduce a significant new problem, especially when utilized in conjunction with the manufacture of integrated circuit devices that incorporate copper.

Copper is currently being implemented as an interconnect material in favor of prior aluminum interconnect technologies. Copper offers several important advantages over aluminum. The higher conductivity of copper simplifies interconnect routing. This reduces the number of interconnect levels from 12 to 6, which removes upwards of 200 process steps and has a direct impact on device yield. Chips with copper interconnects operate with less power at a given frequency than chips with aluminum interconnects. Accordingly, copper interconnect technology enables devices with significantly higher performance for mobile applications. Finally, for very small features, the interconnect delay for copper and low-k materials is approximately one-half that of aluminum and SiO2. Copper interconnects are accordingly preferred for very small features because it provides speed enhancement with no sacrifice of device reliability.

Where copper in such devices is exposed to the etching environment, the use of an oxygen plasma often results in damage to the copper lines by generating copper-containing residue, which may deposit on the trench and via sidewalls causing copper contamination of the dielectric materials. Eventual migration of the copper to the transistor level of the device leads to failure of the device due to copper poisoning.

Many current integrated circuit fabrication technologies utilize a photoresist stripping step following one or more of the patterning steps used to form the features in the wafer. If a methodology could be found which not only completed a dielectric etch step, but simultaneously removed the photoresist from the surface of the wafer, a process step, that of the separate photoresist strip, could be eliminated. This of course would result in lower process times and higher throughput.

From the foregoing, a low-k etch process which implements higher etch rates than previous N2/H2 processes while avoiding the problems associated with prior N2/H2 processes would be very desirable.

It would also be very desirable to avoid the previously discussed problems with RIE lag, etch rate, and especially profile control.

It would moreover be very desirable to provide an etching process which exhibits a much higher degree of selectivity between the organic low-k dielectric and the hard mask required to form features through the dielectric. It would also be advantageous if the etch process could minimize the effect of "micro-masking" at the bottom of the etched feature. Micro-masking occurs when the etch process etches away a portion of the hard mask and subsequently re-deposits elements of the etched hard mask at the bottom of etched features.

It would be very advantageous if a dielectric etch process could be implemented which achieved the previous advantages while enabling a more stable etch plasma over a wider band of pressure and power operations than current N2/H2 processes.

In order to maintain a high wafer throughput, what is also desirable is that the methodology be capable of being performed in situ within the fabrication equipment utilized to form the wafer.

Finally, it would be very desirable if these advantages could be implemented using existing integrated circuit manufacturing equipment.

These and other features of the present invention will be described in more detail in the section entitled detailed description of the preferred embodiments and in conjunction with the following figures.

SUMMARY OF THE INVENTION

The present invention teaches a process chemistry utilizing ammonia, NH3, as an active etchant for etching features in wafers incorporating organic low-k dielectrics. The process results in significantly higher etch rates than previous N2/H2 processes and which avoids the previously discussed problems with RIE lag and especially profile control. The process exhibits a much higher degree of selectivity between organic low-k dielectrics and commonly utilized hard mask materials. The process disclosed by the present invention enables a more stable etch plasma over a wider band of pressure and power operations than current N2/H2 processes. The process disclosed herein is capable of being performed in situ within the fabrication equipment utilized to form the wafer, and is capable of implementation on a wide variety of existing integrated circuit manufacturing equipment. The ammonia etchant not only etches the organic low-k dielectric, but also removes the photoresist from the surface of the wafer.

The use of ammonia as an organic low-k dielectric etchant may combined with other etch routines to form features through a wide variety of films to implement any number of integrated circuit designs.

BRIEF DESCRIPTION OF THE DRAWING

For more complete understanding of the present invention, reference is made to the accompanying Drawing in the following Detailed Description of the Preferred Embodiments. In the drawing.

Reference numbers refer to the same or equivalent parts of the invention throughout the several figures of the Drawing.

DETAILED DESCRIPTION OF THE PREFERRED EMBODIMENTS

The present invention teaches a novel etch chemistry for etching a wide variety of feature sizes and shapes in wafers incorporating organic low-k dielectrics. The methodology taught herein results in minimal RIE lag, minimal bowing of the trenches and vias formed by the etch process, good etch profiles, and good etch uniformity across the wafer.

In order to etch a variety of features, including but specifically not limited to trenches and vias, in wafers including organic low-k dielectric layers the present invention implements ammonia as an etchant.

Figure 1A:
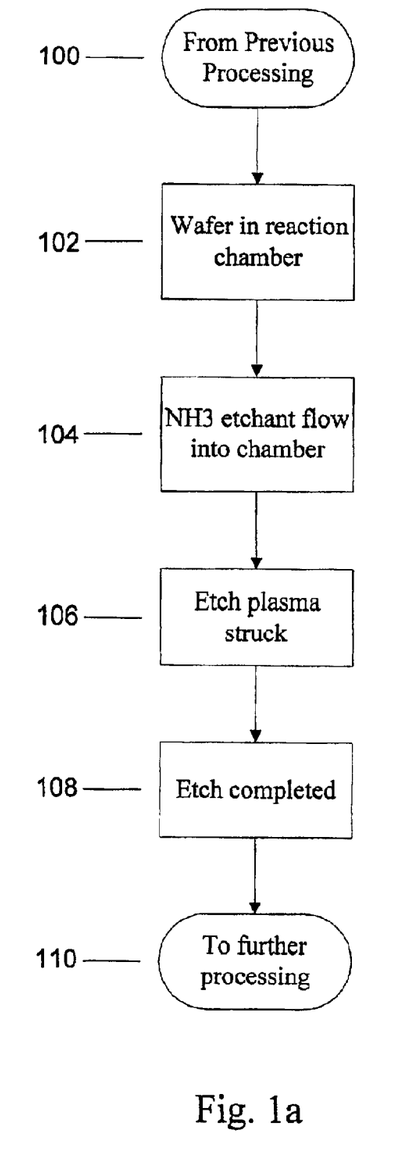
FIG. 1a is an overview flowchart of a process for etching a layer of organic low-k dielectric as part of an integrated circuit device.

Having reference to FIG. 1a, in order to practice the process, 100, of the present invention a wafer is situated within a reaction vessel capable of forming an etch plasma. This reaction vessel or chamber may be an item of single purpose etching equipment, or may be a multiple purpose wafer processing system. One equipment particularly well suited for practicing the present invention is the Exelan™ dry etch system, available from Lam Research Corporation, Fremont, Calif. Exelan™ is capable of performing hardmask open, inorganic and organic ARC etch, and photoresist strip in situ within a single chamber. Alternative equipment may of course be utilized.

The wafer, previously having had a layer of patterned photoresist applied to upper surface thereof, is mounted within the chamber at 102, a flow of etchant gas is introduced into the chamber at 104, and an etch plasma struck at 106. As previously discussed, this etchant gas comprises ammonia, NH3.

The present invention may conveniently be implemented as part of a multi-step etch regime, for instance as shown at FIGS. 1b and 2a–d. Having reference now to FIG. 2a, an example wafer, 1, having a patterned layer of photoresist, 10, is shown. In this example, wafer 1 includes a silicon substrate, 22 having deposited thereon a silicon carbide barrier layer, 20. Deposited over barrier layer 20 is a first layer 18 of organic low-k dielectric, for instance Dow Chemical's SiLK™. A metallized structure, not shown, may be formed under the barrier layer 20. A thin silicon carbide trench stop layer 16, is deposited between the first organic low-k layer 18 and the second organic low-k layer 14 to form a dual damascene structure, not shown. A second organic low-k layer 14, also of SiLK™, is deposited over trench stop layer 16. A hard mask layer of PEARL™, a plasma-enhanced anti-reflective layer also available from Novellus Systems, Inc. San Jose, Calif. is deposited over second organosilicate layer 14, completing the example in wafer stack. Patterned photoresist layer 10, previously discussed, is applied over hard mask 12. Of course, it will be recognized by those having skill in the art that this wafer stack is exemplary only. Alternative structures and films, known to those having skill in the art may be utilized to implement alternative integrated circuit designs.

Referring now to FIGS. 1b and 2a–d one multi-step etch process 200, which utilizes an ammonia etch step employing the dual-frequency etch equipment previously discussed, is disclosed. Several of the process parameters of the present invention may be modified to suit varying conditions, etchant gas combinations, and wafer stack compositions. Certain preferred embodiments, and their alternatives will be discussed below.

Figure 1B:
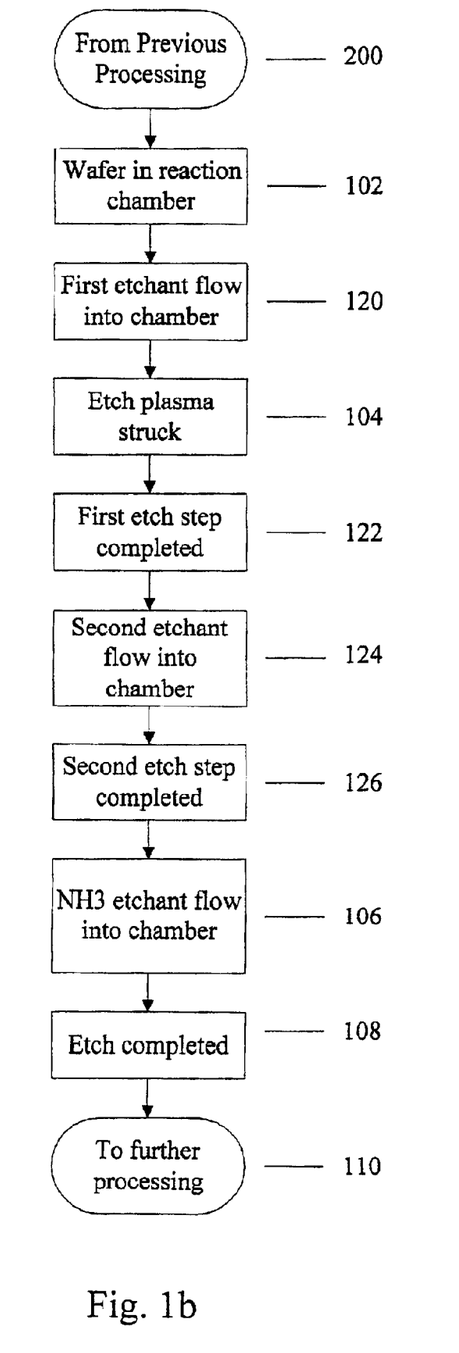
FIG. 1b is an overview flowchart of a process for etching a feature through a wafer stack incorporating two layers of organic low-k dielectric separated by an trench stop layer, and incorporating a hard mask.

At 102 the wafer is situated within the reaction chamber. At 120 a flow of a first, selective etchant gas is introduced into the chamber of the dual-frequency etch equipment previously discussed. At 104 the etch plasma is struck. According to one embodiment, the first etchant gas is a mixture including Ar, oxygen, carbon tetrafluoromethane CF4, and octafluorocyclobutane, C4F8. This mixture is of course highly application specific, and alternative etch steps implementing alternative etchants and diluents may be used either before or after an NH3 etch step according to the present invention.

According to one embodiment of the present invention, the first, selective, etch step is conducted at a chamber pressure of between 0 and 250 mTorr, more preferably between 10 and 100 mTorr, more preferably still between 40 and 80 mTorr, and most preferably at about 70 mTorr.

The upper frequency of the plasma is formed at power levels from about 250 W to about 2500 W. More preferably, the upper power level is formed from about 250 W to about 1500 W. More preferably still, this power level is set at between about 250 to about 1000 W. Most preferably the upper frequency power is set at about 500 W.

The lower frequency power level is set at power levels from about 250 W to about 2500 W. More preferably, the upper power level is formed from about 500 W to about 2000 W. More preferably still, this power level is set at between about 750 W to about 2000 W. Most preferably the lower frequency power is set at about 1000 W.

The mixture of the first etchant gas is preferably comprised of flows of the constituent etch gasses. These include oxygen, O2, at flows from about 3 sccm to about 300 sccm, more preferably from about 5 sccm to about 75 sccm, more preferably still from about 10 sccm to about 50 sccm and most preferably at about 15 sccm. This first etchant gas also contains argon as a diluent, at flows from about 10 sccm to about 500 sccm, more preferably from about 50 sccm to about 250 sccm, more preferably still from about 100 sccm to about 200 sccm and most preferably at about 160 sccm.

The etchant further includes a flow of octafluorocyclobutane, C4F8, from about 1 sccm to about 50 sccm, more preferably from about 3 sccm to about 30 sccm, more preferably still from about 5 sccm to about 20 sccm and most preferably at about 5 sccm. A final etch gas constituent in this embodiment is CF4, tetrafluoromethane at a flow rate from about 1 sccm to about 100 sccm, more preferably from about 10 sccm to about 75 sccm, more preferably still from about 20 sccm to about 50 sccm and most preferably at about 40 sccm.

Etching proceeds at a controlled temperature, for a specified period of time. In the exemplar under discussion, the first etch may proceed at temperatures between 0° C. and 60° C. More particularly from about 5° C. to about 50° C. More particularly still, from about 10° C. to about 40° C., and most preferably at about 40° C. First etch times may further vary from small fractions of a second to about 10 minutes, and are situation dependent. In the example presented here, etching at the most preferable power settings, gas flows and temperature, the first, selective etch was accomplished in about 28 seconds. This etch step provides a high degree of selectivity between the organosilicate dielectric 14 and the stop layer 16.

Figure 2A:
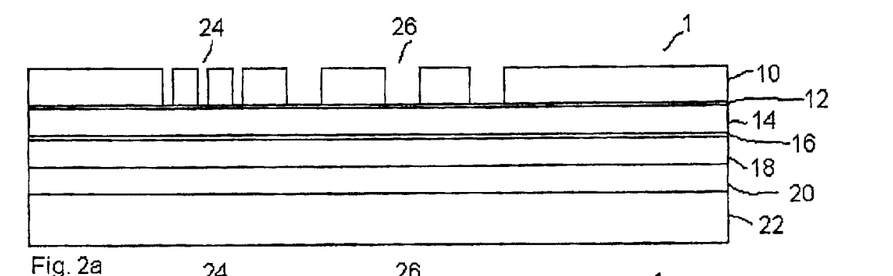
FIG. 2a is a cross-section through a test wafer having applied thereto a patterned layer of photoresist prior to etching.
Figure 2B:
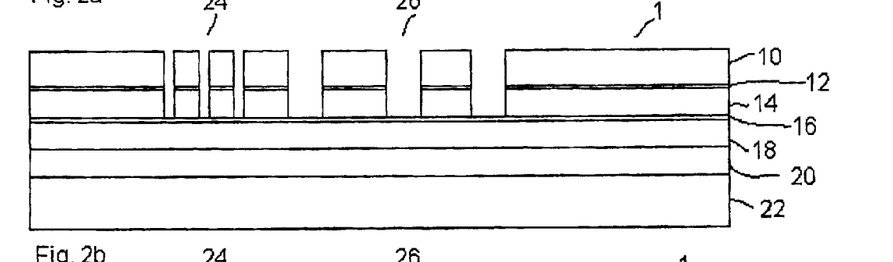
FIG. 2b is a cross-section through the test wafer following a first etch step.

In order to accomplish the preceding temperature control, the temperature of the wafer is thermally maintained by a flow of coolant gas through the chuck retaining the wafer in the reaction vessel, sometimes referred to as ESC, or electrostatic chuck, temperature. This flow of coolant gas, for instance helium, is at a flow rate from about 1 sccm to about 50 sccm, more preferably from about 2 sccm to about 30 sccm, more preferably still from about 10 sccm to about 20 sccm and most preferably at about 15 sccm. Etching proceeds until the desired etch results have been met. In this example, the first etch step proceeds until the etch reaches the etch stop layer, 16, as shown at FIG. 2b. This corresponds to step 122.

To accomplish the second etch step, 124, which in this example is a non-selective etch through stop layer 16, several of the previously discussed process parameters are changed. The second etch is conducted at a chamber pressure of between 0 and 250 mTorr, more preferably between 10 and 100 mTorr, more preferably still between 40 and 90 mTorr, and most preferably at about 55 mTorr.

The upper frequency of the plasma is formed at power levels from about 250 W to about 2500 W. More preferably, the upper power level is formed from about 500 W to about 2000 W. More preferably still, this power level is set at between about 1000 W to about 1500 W. Most preferably the upper frequency power is set at about 1400 W.

The lower frequency power level is set at power levels from about 250 W to about 2500 W. More preferably, the upper power level is formed from about 500 W to about 2000 W. More preferably still, this power level is set at between about 750 W to about 2000 W. Most preferably the lower frequency power is set at about 1000 W.

The mixture of the second etchant gas is again preferably comprised of flows of the constituent etch gasses. These include oxygen, O2, at flows from about 3 sccm to about 300 sccm, more preferably from about 5 sccm to about 150 sccm, more preferably still from about 7 sccm to about 50 sccm and most preferably at about 9 sccm. This second etchant gas also contains argon as a diluent, at flows from about 10 sccm to about 500 sccm, more preferably from about 50 sccm to about 250 sccm, more preferably still from about 100 sccm to about 200 sccm and most preferably at about 140 sccm.

The etchant further includes a flow of octafluorocyclobutane, C4F8, from about 1 sccm to about 50 sccm, more preferably from about 5 sccm to about 30 sccm, more preferably still from about 10 sccm to about 20 sccm and most preferably at about 15 sccm.

Figure 2C:
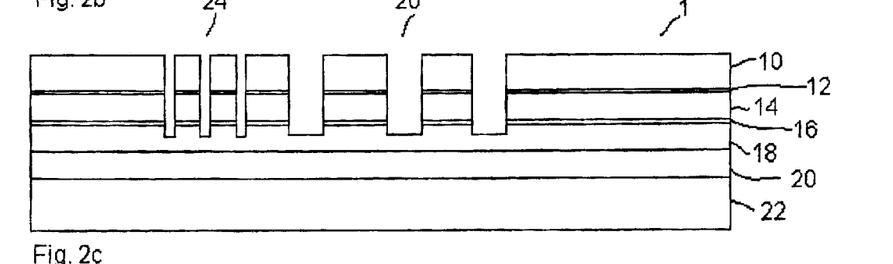
FIG. 2c is a cross-section through the test wafer following a second, non-selective etch step.

Again, etching proceeds at a controlled temperature, for a specified period of time. In the exemplar under discussion, the second etch may proceed at temperatures between 0° C. and 60° C. More particularly from about 50° C. to about 50° C. More particularly still, from about 10° C. to about 40° C., and most preferably at about 40° C. Again, etch temperature was maintained by a flow of coolant gas applied to the backside of the wafer in the process chuck. Process times may further vary from small fractions of a second to about 10 minutes, and are situation dependent. In the example presented here, processed at the most preferable power settings, gas flows and temperature, the second etch was accomplished in about 10 seconds. This etch step provides a low degree of selectivity between the organosilicate dielectric 18 and the stop layer 16. Etch step 124 proceeds at least until etch stop 16 has been etched through, as shown at FIG. 2c. In this example, this etch step also etches through a portion, but not all, of OSG layer 18. At this point step 126 is reached.

To complete the etching of the feature, a third selective etch step, 106 is conducted. To perform step 106, an etch through the remainder of OSG layer 18, several of the previously discussed process parameters are again changed. The third etch is conducted at a chamber pressure of between 0 and 500 mTorr, more preferably between 10 and 250 mTorr, more preferably still between 100 and 200 mTorr, and most preferably at about 160 mTorr.

The upper frequency of the plasma is formed at power levels from about 150 W to about 2500 W. More preferably, the upper power level is formed from about 250 W to about 1500 W. More preferably still, this power level is set at between about 250 to about 1000 W. Most preferably the upper frequency power is set at about 500 W.

The lower frequency power level is set at power levels from about 0 W to about 2500 W. More preferably, the lower power level is formed from about 0 W to about 1000 W. More preferably still, this power level is set at between about 0 W to about 100 W. Most preferably the lower frequency power is set at about 0 W.

The mixture of the third etchant gas is again preferably comprised of a flow of etchant gases. In one preferred embodiment, this etchant gas comprises ammonia, NH3, 5 sccm to about 1500 sccm, more preferably from about 100 sccm to about 1000 sccm, more preferably still from about 300 sccm to about 800 sccm and most preferably at about 600 sccm.

While one embodiment of this invention contemplates the use of NH3 alone as the etchant, alternative embodiments contemplate the use of diluents. An alternative could contain helium or other known etchant gas diluents.

Once again, etching proceeds at a controlled temperature, for a specified period of time. In the exemplar under discussion, the third etch may proceed at temperatures between 0° C. and 60° C. More particularly from about 5° C. to about 50° C. More particularly still, from about 10° C. to about 40° C., and most preferably at about 40° C. Again, etch temperature was maintained by a flow of coolant gas applied to the backside of the wafer in the process chuck. Process times may further vary from small fractions of a third to about 10 minutes, and are situation dependent. In the example presented here, processed at the most preferable power settings, gas flows and temperature, the third etch was accomplished in about 205 seconds. This etch step provides a high degree of selectivity between the organosilicate dielectric 18 and the barrier 20. Following etch step 106, etching is completed at 108 and the wafer is available for further processing at 110.

Figure 2D:
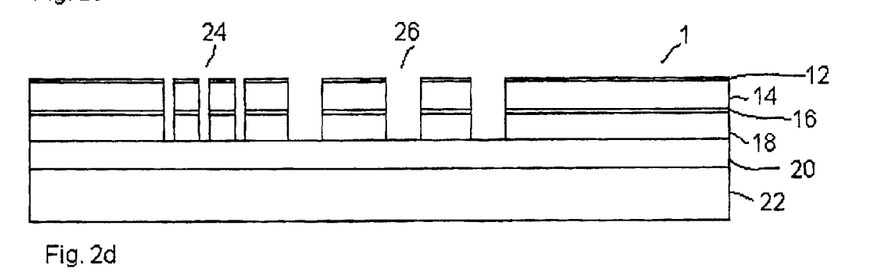
FIG. 2d is a cross-section through the test wafer following the third etch step employing ammonia as a final etchant to form the feature.

At this point in the etch regime, the features, for instance 24 and 26, defined by photoresist layer 10 have now been etch through the hard mask layer 12, first OSG dielectric layer, 14, trench stop layer 16, and second OSG dielectric layer 20. The feature is completely etched when barrier layer 20 is reached, as shown at FIG. 2d. At this point, the previously discussed etching and stripping steps have been completed, features 24 and 26 formed in wafer stack 1, and photoresist layer 10 stripped from that wafer stack. The wafer stack is now ready for further patterning, doping or deposition steps as required to complete the integrated circuit device.

Figure 3:
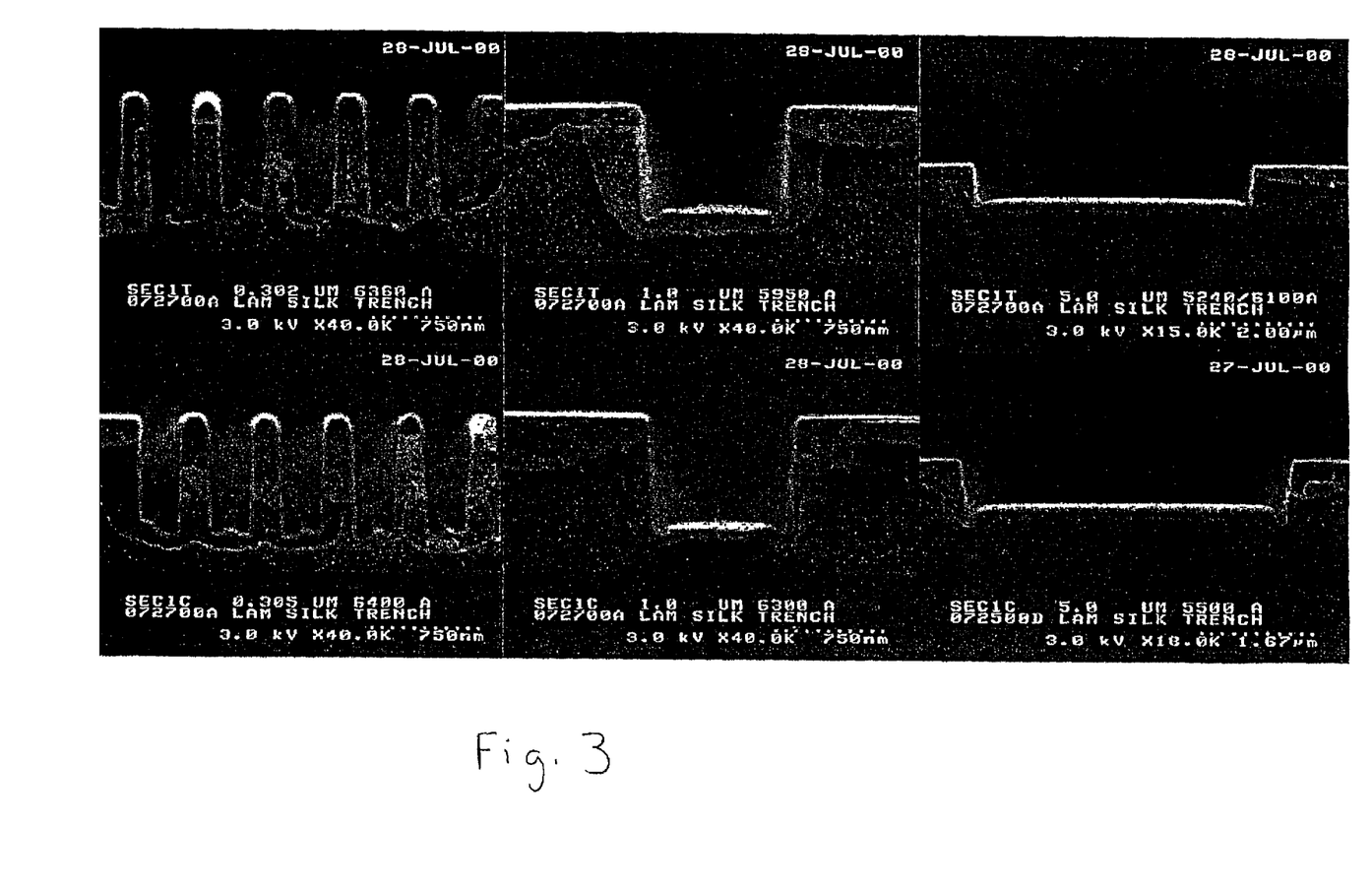
FIG. 3 is a photomicrograph through a test wafer, displaying the profile control achieved by the present invention.

Process 200 provides several novel advantages. First among these is the extraordinary degree of control of profile control enabled by the methodology of the present invention. This is shown at FIG. 3, a photomicrograph of a comb structure etched in accordance with the present invention. The extremely anisotropic etch profiles enabled herewith are readily apparent.

A second advantage is that all photoresist has been stripped from the wafer by the NH3 during the third etch step. This obviates the need for a separate photoresist strip step in wafer fabrication.

One advantage noted during testing of the present invention is the notable lack of bowing produced by the NH3 etches. It is postulated that where there is insufficient ion bombardment, for instance on the sidewalls of vias and trenches, the NH3 reacts with the low-k dielectric to form a polymer, possibly an azide with terminating-NH2 groups. This resultant polymer passivates the sidewall and prevents profile bowing. The polymer formation appears to be temperature dependent and possibly reaction-rate controlled. The sidewall polymer thickness and integrity increases with increasing temperature.

Another embodiment of the present invention contemplates the addition of methyl fluoride, CH3F during the final etch step, 106. This addition has been shown to reduce the effects of the previously discussed micro-masking. In one embodiment, a flow of CH3F from about 1 sccm to about 50 sccm is added to the NH3 etch step previously discussed. More preferably this flow is from about 5 sccm to about 30 sccm, more preferably still from about 10 sccm to about 20 sccm and most preferably at about 10 sccm.

In order to accomplish the preceding temperature control, the temperature of the wafer is thermally maintained by a flow of coolant gas through the chuck retaining the wafer in the reaction vessel. This flow of coolant gas, for instance helium, is at a flow rate from about 1 sccm to about 50 sccm, more preferably from about 2 sccm to about 30 sccm, more preferably still from about 10 sccm to about 20 sccm and most preferably at about 15 sccm.

Not shown in this figure is the previously discussed copper feature. By utilizing an NH3 etchant, oxidation of the copper feature is obviated, and attendant copper poisoning of the transistor effect of the device is precluded.

A specific feature of the present invention is its novel ability to form features of widely varying size contemporaneously, with excellent profile control and with minimal RIE lag, minimal bowing of the vias formed by the etch process, good etch profiles, good resist selectivity, and good etch uniformity across the wafer.

It will be apparent to those having ordinary skill in the art that the previously discussed power levels, pressures, flow rates, and temperatures are by way of example only. Different dielectric materials disposed at varying thicknesses in the wafer stack may require different combinations of power, pressure, flow, and temperature. The principles in the present invention specifically contemplate all such combinations.

The present invention has been particularly shown and described with respect to certain preferred embodiments of features thereof. However, it should be readily apparent to those of ordinary skill in the art that various changes and modifications in form and detail may be made without departing from the spirit and scope of the invention as set forth in the appended claims. In particular, the principles of the present invention specifically contemplate the incorporation of one or more of the various features and advantages taught herein on a wide variety of integrated circuit devices formed of varying wafer stack configurations defined by a number of different layers. The previously discussed process variables are of course capable of modification by those having skill in the art to effect different integrated circuit devices. Each of these alternatives is specifically contemplated by the principles of the present invention.

What is claimed is:

1. A method of etching an organic dielectric layer over a substrate, comprising:

placing a hard mask over the organic dielectric layer;

placing a patterned photoresist layer over the hard mask layer;

placing the substrate in an etching chamber;

providing an etchant gas comprising NH3 into the etching chamber, wherein the NH3 has a flow rate between 5 sccm to 1500 sccm;

generating a plasma from the NH3, which selectively etches the organic dielectric layer with respect to the hardmask; and simultaneously stripping the photo resist layer during the etching of the organic dielectric layer.

2. The method, as recited in claim 1, wherein the organic dielectric layer is made of an organic low-k material, and wherein the simultaneous stripping completely strips the photoresist layer.

3. The method, as recited in claim 1, further comprising providing a bias power of between about 0 W and 100 W during etching of the organic dielectric layer.

4. The method, as recited in claim 1, further comprising providing CH3F while providing the etchant gas comprising NH3.

5. The method, as recited in claim 4, further comprising providing an etch with an etchant gas comprising CF4, prior to the step of providing the etchant gas comprising NH3.

6. The method, as recited in claim 5, wherein the etchant gas comprising CF4, further comprises C4F8.

7. The method, as recited in claim 6, wherein the etchant gas comprising CF4 further comprises O2.

8. A method of etching an organic low-k dielectric layer over a substrate, comprising:

placing a hard mask over the organic low-k dielectric layer;

placing a patterned photoresist layer over the hard mask layer;

placing the substrate in an etching chamber;

providing an etchant gas comprising NH3 into the etching chamber;

generating a plasma from the NH3, which is able to selectively etch the organic low-k dielectric layer with respect to the hard mask and strips the photoresist layer;

selectively etching the organic low-k dielectric layer with respect to the hardmask; and simultaneously stripping the photo resist layer during the selective etching of the organic low-k dielectric layer.

9. The method, as recited in claim 8, wherein the NH3 has a flow rate, wherein the flow rate of NH3 is from about 100 sccm to about 1000 sccm.

10. The method, as recited in claim 8, wherein the NH3 has a flow rate from about 300 sccm to about 800 sccm.

11. The method, as recited in claim 10, further comprising maintaining the substrate at a temperature between about 10° C. to about 40° C. during etching of the organic dielectric layer.

12. The method, as recited in claim 8, further comprising providing a bias power of between about 0 W and 100 W during etching of the organic low-k dielectric layer.

13. The method, as recited in claim 8, wherein the simultaneous stripping completely strips the photoresist.

14. The method, as recited in claim 8, wherein the etchant gas comprising NH3 uses NH3 alone as the etchant.

15. The method, as recited in claim 8, further comprising:

placing an etch stop layer over the organic low-k dielectric layer;

placing a second organic low-k dielectric layer over the etch stop layer, wherein the second organic low-k dielectric layer is between the organic low-k dielectric layer and the hardmask.

16. The method, as recited in claim 15, further comprising etching the second organic low-k dielectric layer with a first etch, wherein the first etch provides a bias power of between about 250 W to about 2500 W before selectively etching the organic low-k dielectric layer.

17. The method, as recited in claim 16, further comprising providing a bias power of between about 0 W and 100 W during etching of the organic dielectric layer.

18. The method, as recited in claim 17, further comprising providing an etchant gas comprising CF4 for the etching the second low-k organic dielectric layer.

19. The method, as recited in claim 18, wherein the etchant gas comprising CF4 further comprises C4F8.

20. The method, as recited in claim 19, wherein the etchant gas comprising NH3 uses NH3 alone as the etchant.

21. A method of etching an organic dielectric layer disposed below a hardmask layer and over a substrate, comprising:

placing the substrate in an etching chamber;

providing an etchant gas comprising NH3 into the etching chamber with a flow rate from about 300 sccm to about 800 sccm;

generating a plasma from the NH3, which etches the organic dielectric layer; and maintaining the substrate at a temperature between about 10° C. to about 40° C. during the etching of the organic dielectric layer.

* * * * *